United States Patent
Nitta et al.

(10) Patent No.: US 8,030,730 B2
(45) Date of Patent: Oct. 4, 2011

(54) SEMICONDUCTOR DEVICE AND MANUFACTURING METHOD THEREOF

(75) Inventors: Tetsuya Nitta, Hyogo (JP); Takayuki Igarashi, Hyogo (JP)

(73) Assignee: Renesas Electronics Corporation, Kanagawa (JP)

( * ) Notice: Subject to any disclaimer, the term of this patent is extended or adjusted under 35 U.S.C. 154(b) by 71 days.

(21) Appl. No.: 12/401,889

(22) Filed: Mar. 11, 2009

(65) Prior Publication Data

US 2009/0200610 A1 Aug. 13, 2009

Related U.S. Application Data

(62) Division of application No. 11/152,790, filed on Jun. 15, 2005, now abandoned.

(30) Foreign Application Priority Data

Jun. 22, 2004 (JP) ................................. 2004-183365
Apr. 22, 2005 (JP) ................................. 2005-125243

(51) Int. Cl.
*H01L 29/00* (2006.01)

(52) U.S. Cl. ........ 257/501; 257/500; 257/510; 257/506; 438/221

(58) Field of Classification Search .......... 257/500–501, 257/510, 506, 605, 396–397, E27.112; 438/221
See application file for complete search history.

(56) References Cited

U.S. PATENT DOCUMENTS

| | | | |
|---|---|---|---|
| 5,241,210 A | 8/1993 | Nakagawa et al. | |
| 5,343,067 A | 8/1994 | Nakagawa et al. | |
| 5,434,444 A | 7/1995 | Nakagawa et al. | |
| 5,519,241 A | 5/1996 | Oppermann et al. | |
| 5,536,961 A | 7/1996 | Nakagawa et al. | |
| 5,646,063 A | 7/1997 | Mehta et al. | |
| 5,943,578 A | 8/1999 | Katakabe et al. | |
| 6,242,763 B1 | 6/2001 | Chen et al. | |
| 6,355,537 B1 | 3/2002 | Seefeldt | 438/405 |

(Continued)

FOREIGN PATENT DOCUMENTS

JP 02-016751 A 1/1990

(Continued)

OTHER PUBLICATIONS

Japanese Notice of Grounds of Rejection, w/ English translation thereof, issued in Japanese Patent Application JP 2005-125243 dated May 10, 2011.

*Primary Examiner* — Theresa T Doan

(74) *Attorney, Agent, or Firm* — McDermott Will & Emery LLP

(57) ABSTRACT

An N-layer is formed on a semiconductor substrate, with a BOX layer interposed. In the N-layer, a trench isolation region is formed to surround the N-layer to be an element forming region. The trench isolation region is formed to reach the BOX layer, from the surface of the N-layer. Between trench isolation region and the N-layer, a P type diffusion region 10a is formed. The P type diffusion region is formed continuously without any interruption, to be in contact with the entire surface of an inner sidewall of the trench isolation region surrounding the element forming region. In the element forming region of the N-layer, a prescribed semiconductor element is formed. Thus, a semiconductor device is formed, in which electrical isolation is established reliably, without increasing the area occupied by the element forming region.

4 Claims, 13 Drawing Sheets

U.S. PATENT DOCUMENTS

| | | |
|---|---|---|
| 6,429,502 B1 | 8/2002 | Librizzi et al. |
| 6,518,146 B1 | 2/2003 | Singh et al. |
| 6,569,700 B2 | 5/2003 | Yang |
| 6,646,319 B2 * | 11/2003 | Itakura et al. ............ 257/500 |
| 6,676,748 B1 | 1/2004 | Himi et al. |
| 6,987,303 B2 | 1/2006 | Yu |
| 7,041,572 B2 | 5/2006 | Yang et al. |
| 2002/0121658 A1 | 9/2002 | Liu et al. |
| 2003/0119245 A1 | 6/2003 | Iwamatsu et al. |
| 2004/0145027 A1 | 7/2004 | Nitta et al. |
| 2005/0090047 A1 | 4/2005 | Hawley et al. |
| 2005/0090073 A1 | 4/2005 | Hawley et al. |
| 2005/0179071 A1 | 8/2005 | Mouli |
| 2005/0212071 A1 | 9/2005 | Yue et al. |
| 2005/0282375 A1 | 12/2005 | Nitta et al. |

FOREIGN PATENT DOCUMENTS

| | | |
|---|---|---|
| JP | 04-123456 A | 4/1992 |
| JP | 05-136436 A | 6/1993 |
| JP | 07-169868 A | 7/1995 |
| JP | 2001-044437 A | 2/2001 |
| JP | 2001-210811 A | 8/2001 |
| JP | 2001-345377 A | 12/2001 |
| JP | 2003-197639 A | 7/2003 |
| JP | 2004-031505 A | 1/2004 |

* cited by examiner

SEMICONDUCTOR DEVICE AND MANUFACTURING METHOD THEREOF

RELATED APPLICATIONS

This application is a divisional of U.S. application Ser. No. 11/152,790, filed Jun. 15, 2005 now abandoned, claiming priority of Japanese Application Nos. JP2004-183365, filed Jun. 22, 2004 and JP2005-125243, filed Apr. 22, 2005, the entire contents of each of which are hereby incorporated by reference.

BACKGROUND OF THE INVENTION

1. Field of the Invention

The present invention relates to a semiconductor device and manufacturing method thereof and, more specifically, to a semiconductor device having a trench isolation structure and a method of manufacturing the same.

2. Description of the Background Art

In a semiconductor device having an integrated circuit that must withstand a high voltage, an isolation structure for electrically separating elements from each other is necessary, in order to avoid electrical influence between elements. Particularly, trench isolation has been known as a superior method of element isolation to attain higher degree of integration, as it requires relatively small area for separating elements. An isolation structure having a combination of an SOI (Silicon On Insulator) substrate and the trench isolation has been highly appreciated as one element can fully be isolated from another element electrically so that parasitic operation between elements can be suppressed.

An example of a semiconductor device using such an SOI substrate will be described. An N− layer is formed on a silicon semiconductor substrate with a BOX (Buried OXide Layer) layer interposed. In the N− layer, an element forming region is formed, and a trench isolation region is formed for separating elements. In the element forming region, an n channel type MOS (Metal Oxide Semiconductor) transistor including a source, drain, gate and a body is formed as a semiconductor element.

In semiconductor devices described in Japanese Patent Laying-Open Nos. 2001-044437 and 2003-197639, semiconductor devices having a P type region formed to be in contact with the trench isolation region are proposed. The conventional semiconductor devices using an SOI substrate are structured as described above.

In the conventional semiconductor device, the N− layer in the element forming region is in contact with the trench isolation region, and therefore, when the MOS transistor is off, an electric field reaches the trench isolation region. Therefore, in order to prevent decrease in main breakdown voltage of the MOS transistor caused by electric field concentration near the trench isolation region, it has been necessary to ensure a sufficient distance between the P type impurity region as the body of the MOS transistor formed in the element forming region and the trench isolation region. As a result, the element forming region comes to occupy a large area.

When the MOS transistor is off, the electric field reaches even the inside of the trench isolation region, possibly eroding reliability over a long period dependent on the material of the trench isolation region.

Further, in some state of operation of the MOS transistor, a P type inverted layer may be formed on an upper surface of the BOX layer. At this time, as the P type impurity region formed on the surface of the N− layer is not in contact with the BOX layer, formation of the inverted layer delays in a high speed operation, undesirably decreasing the switching speed.

In the semiconductor devices described in Japanese Patent Laying-Open Nos. 2001-044437 and 2003-197639, the P type region formed to be in contact with the trench isolation region is connected to two or more different electrode terminals. Therefore, it is impossible to control the electric field in the element forming region, and therefore, there has been a limit in improving the performance of trench isolation.

SUMMARY OF THE INVENTION

The present invention was made to solve the above-described problems, and its object is to provide a semiconductor device that enables reliable electrical isolation without increasing the area occupied by the element forming region, and another object is to provide a method of manufacturing such a semiconductor device.

The present invention provides a semiconductor device that includes an insulating film, a semiconductor layer of a first conductivity type, an isolating region, and a first impurity region of a second conductivity type. The insulating film is formed on a main surface of a prescribed substrate. The semiconductor layer of the first conductivity type is formed on the insulating film. The isolating region continuously surrounds a prescribed region to be the element forming region in the semiconductor layer, is formed over the surface of the semiconductor layer to the surface of the insulating film, and has an inner sidewall and an outer sidewall. The first impurity region of the second conductivity type is formed continuously to be in contact with the entire surface of the inner sidewall of the isolating region, and positioned between the isolating region and that portion of the semiconductor layer which is positioned at the prescribed region.

Further, the present invention provides a method of manufacturing a semiconductor device including the following steps. On a semiconductor layer of a first conductivity type formed on a prescribed substrate with an insulating film interposed, a trench is formed to continuously surround a region to be the element forming region and to expose a surface of the insulating film. On an entire surface of that portion of the semiconductor layer exposed in the trench, which is at least on the side where the prescribed region is positioned, an impurity of a second conductivity type is introduced, so as to form a first impurity region of the second conductivity type. Thereafter, the trench is filled with an insulating material.

In the semiconductor device in accordance with the present invention, the first impurity region is formed continuously to be in contact with the entire surface of the inner sidewall of the isolating region. Therefore, the isolating region is electrically isolated by the PN junction between that portion of the semiconductor layer which is positioned in the prescribed region and the first impurity region. As a result, reliability of electric isolation can be enhanced without increasing the area of the element forming region.

By the method of manufacturing a semiconductor device in accordance with the present invention, on the entire surface of that portion of the semiconductor layer which is on the side of the prescribed region, the first impurity region of the second conductivity type is formed. Therefore, a PN junction is formed at the interface between that portion of the semiconductor layer and the first impurity region, and thus, a structure for electrical isolation can easily be formed.

The foregoing and other objects, features, aspects and advantages of the present invention will become more appar-

DESCRIPTION OF THE PREFERRED EMBODIMENTS

First Embodiment

Figure 1:
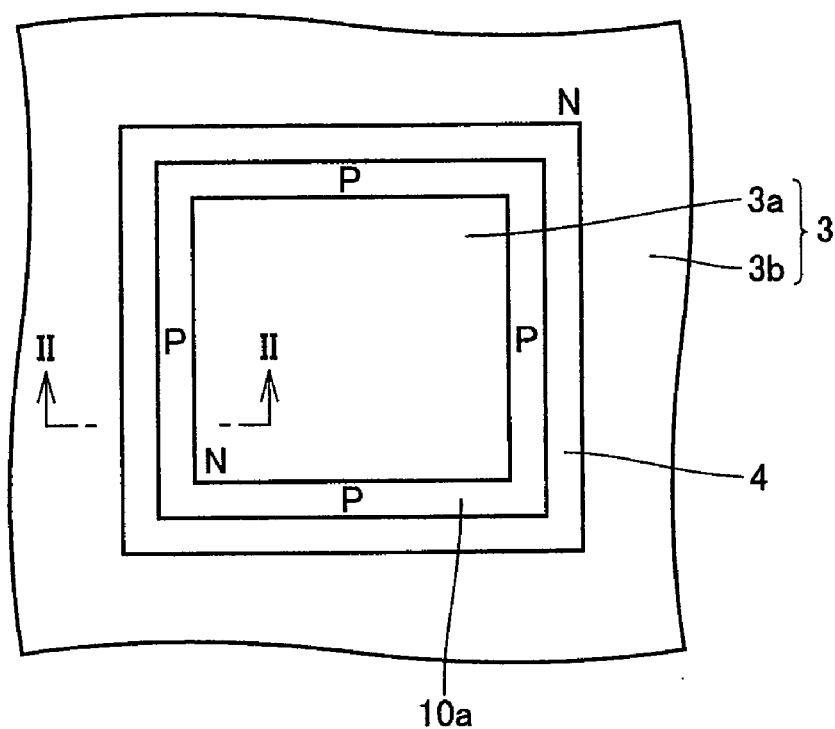
FIG. 1 is a plan view of a semiconductor device in accordance with a first embodiment of the present invention.
Figure 2:
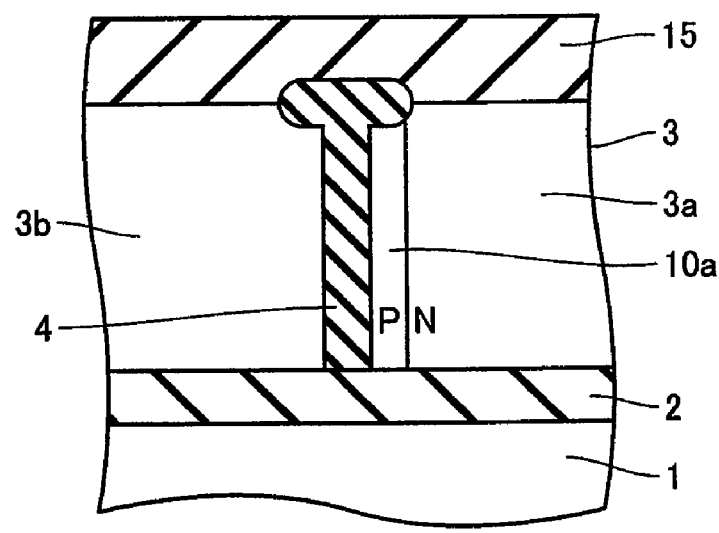
FIG. 2 is a cross-sectional view taken along the line II-II of FIG. 1, in accordance with the same embodiment.

A semiconductor device in accordance with a first embodiment of the present invention will be described. As shown in FIGS. 1 and 2, on a semiconductor substrate 1, a BOX layer 2 is formed. On BOX layer 2, an N– layer 3 of, for example, an epitaxial layer is formed. In N– layer 3, a trench isolation region 4 is formed to surround that portion (N– layer 3a) of N– layer 3 which will be the element forming region. Trench isolation region 4 is formed from the surface of N– layer 3 to reach BOX layer 2. Outside the trench isolation region 4, N– layer 3b is positioned, which will be another element forming region. On N– layer 3, an insulating film 15, such as a silicon oxide film, is formed.

Between trench isolation region 4 and N– layer 3, a P type diffusion region 10a is formed. P type diffusion region 10a is formed continuously without any interruption, to be in contact with the entire surface of an inner sidewall of trench isolation region 4 surrounding the element forming region. In the element forming region such as N– layer 3a, a semiconductor element such as a transistor or a diode, is formed, as will be described later.

In the semiconductor device described above, between the N– layer 3a to be the element forming region and the trench isolation region 4, P type diffusion region 10a is formed continuously without any interruption to be in contact with the entire surface of the inner sidewall of trench isolation region 4. Therefore, trench isolation region 4 is electrically isolated by the PN junction of N– layer 3a and P type diffusion region 10a.

Therefore, as compared with a conventional semiconductor device in which only the element isolating region is formed between the N– layer 3a as an element forming region and the N– layer 3b as another element forming region without P type diffusion region 10a, electrical isolation can be made more reliable by the PN junction.

Further, as compared with another conventional semiconductor device in which a P type region is formed to be in contact with the trench isolation region and the P type region is connected to two or more different electrode terminals as described above, the present semiconductor device can enhance electric isolation. This will be discussed more specifically in the following.

Figure 3:
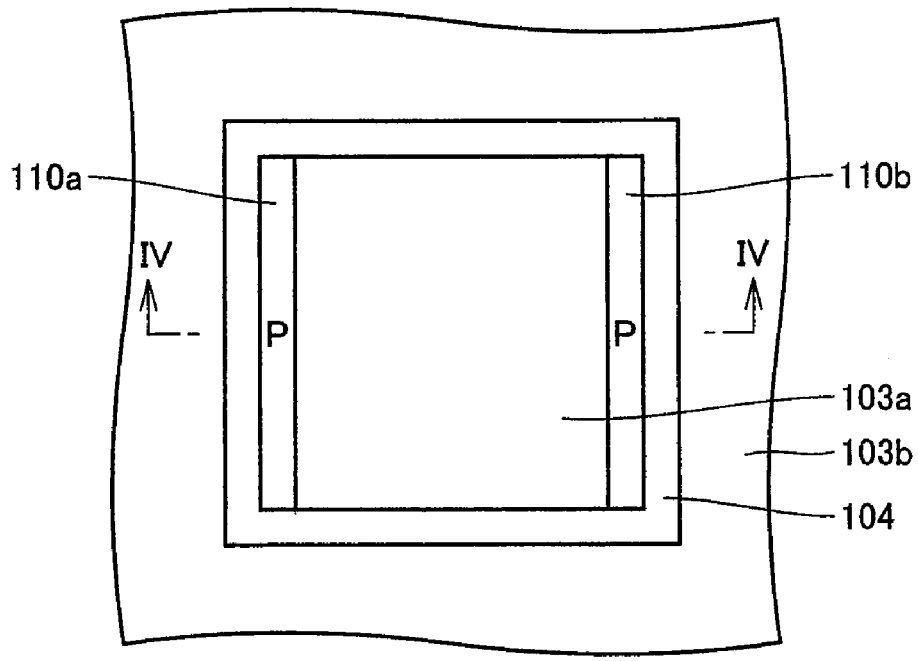
FIG. 3 is a plan view of a semiconductor device as a comparative example of the embodiment.
Figure 4:
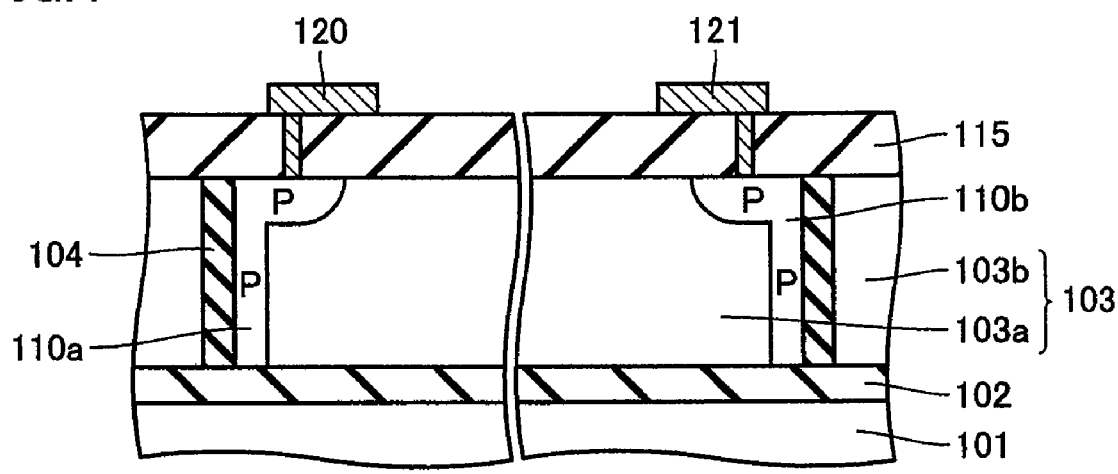
FIG. 4 is a cross-sectional view taken along the line IV-IV of FIG. 3.

As shown in FIGS. 3 and 4, in the said another conventional semiconductor device, an N– layer 103 is formed on a semiconductor substrate 101 with a BOX layer 102 interposed. In N– layer 103, a trench isolation region 104 is formed to surround that portion (N– layer 103a) of N– layer 103 which will be the element forming region. Outside the trench isolation region 104, an N– layer 103b to be another element forming region is positioned. On N– layer 103, an insulating film 115 is formed.

At portions of trench isolation region 104 opposite to each other, P type diffusion regions 110a and 110b are formed respectively, between trench isolation region 104 and N– layer 103a. An electrode 120 is electrically connected to P type diffusion region 110a, and an electrode 121 is electrically connected to P type diffusion region 110b.

Assume that an MOS transistor is formed as the semiconductor element in the element forming region. In that case, P type diffusion region 110a will be the drain region and P type diffusion region 110b will be the source region. Electrode 120 will be the drain electrode, and electrode 121 will be the source electrode. The drain region and the source region make operations different from each other, and therefore, the potentials in the drain region and the source region are different. For this reason, the P type diffusion regions 110a and 110b are not continuous but separated by a distance, and they are not electrically connected.

In this manner, in said another conventional semiconductor device, P type diffusion regions 110a and 110b have mutually different potentials. Therefore, it is difficult to control an electric field inside the element isolating region 104, and hence, electrical isolation attained by element isolation region 104 has been limited.

In contrast, in the semiconductor device in accordance with the present embodiment, P type diffusion region 10a is formed continuously, to be in contact with the entire surface of the inner sidewall of trench isolation region 4. Therefore, the potential of P type diffusion region 10a is always the same. Accordingly, the potential of the inner sidewall that is in contact with P type diffusion region 10a is also kept at the same potential, improving the electrical isolation characteristic.

Second Embodiment

In the semiconductor device described above, the P type diffusion region is formed along the inner sidewall of the trench isolation region. Here, an example will be described in which P type diffusion regions are formed to be in contact with the entire surfaces of inner and outer sidewalls of the trench isolation region.

Figure 5:
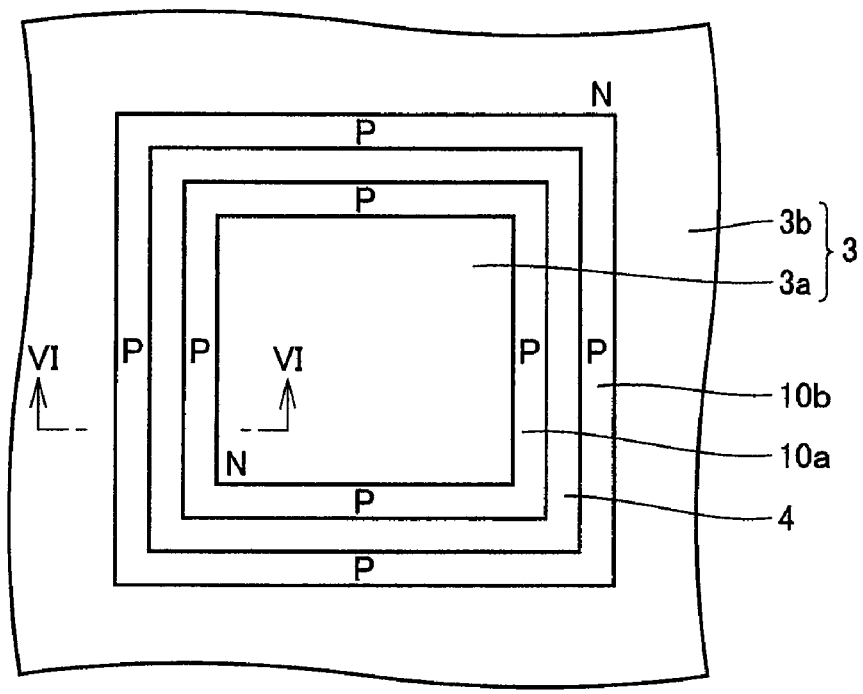
FIG. 5 is a plan view of a semiconductor device in accordance with a second embodiment of the present invention.
Figure 6:
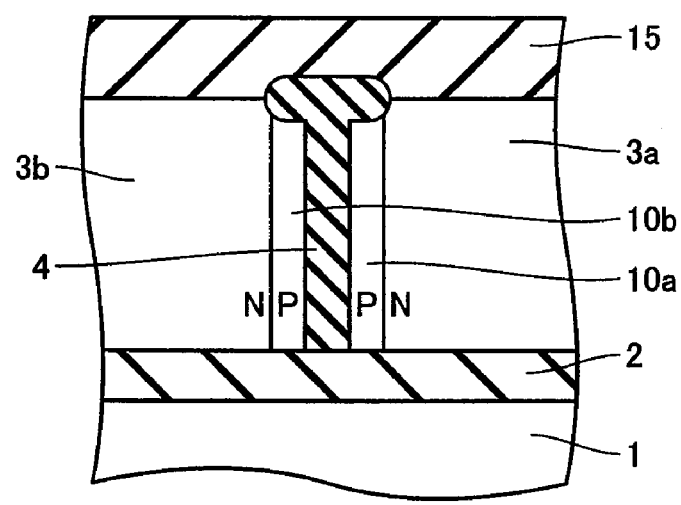
FIG. 6 is a cross-sectional view taken along the line VI-VI of FIG. 5.

As shown in FIGS. 5 and 6, first, between trench isolation region 4 and N− layer 3a, a P type diffusion region 10a is formed. P type diffusion region 10a is formed continuously without any interruption to be in contact with the entire surface of the inner sidewall of trench isolation region 4 surrounding the element forming region.

Between trench isolation region 4 and N− layer 3b also, a P type diffusion region 10b is formed. P type diffusion region 10b is formed continuously to be in contact with the entire surface of the outer sidewall of trench isolation region 4 surrounding the element forming region. Except for this point, the semiconductor device is the same as the one described above, and therefore, the same or corresponding portions are denoted by the same reference characters and description thereof will not be repeated.

In the semiconductor device described above, in addition to P type diffusion region 10a, P type diffusion region 10b is formed between trench isolation region 4 and N− layer 3b as another element forming region. Therefore, trench isolation region 4 comes to be electrically isolated not only by the PN junction between N− layer 3a and P type diffusion region 10a but also by the PN junction between N− layer 3b and P type diffusion region 10b. As a result, electrical isolation between N− layer 3a and N− layer 3b can be made more reliable by the two PN junctions, than in the semiconductor device described above.

Third Embodiment

Figure 7:
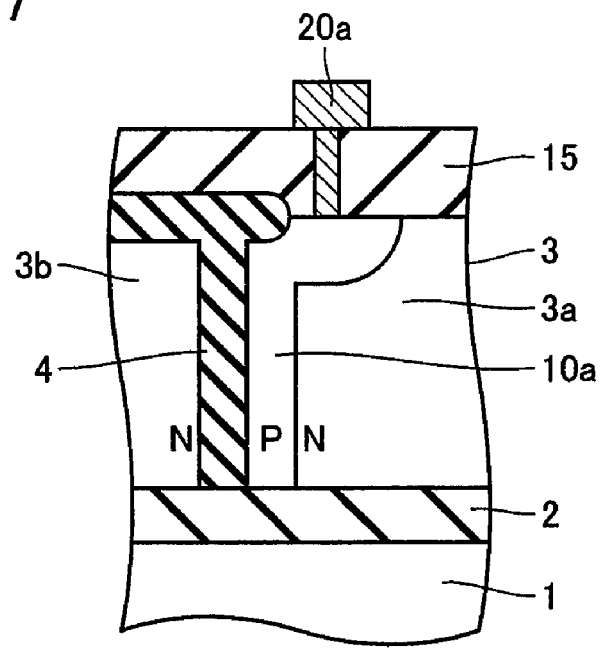
FIG. 7 is a plan view of a semiconductor device in accordance with a third embodiment of the present invention.

As a semiconductor device in accordance with a third embodiment of the present invention, an example will be described in which the P type diffusion region is kept at a prescribed potential. As shown in FIG. 7, on an insulating film 15, an electrode 20a to be electrically connected to P type diffusion region 10a is formed. Except for this point, the semiconductor device is the same as the one shown in FIG. 2. Therefore, the same or corresponding portions will be denoted by the same reference characters, and description thereof will not be repeated.

In the semiconductor device described above, by applying a prescribed voltage to electrode 20a, the potential of P type diffusion region 10a can be kept at a constant value. By way of example, by applying a voltage of 0V to electrode 20a, the potential of P type diffusion region 10a can be kept at 0V. Thus, effect of the electric field generated by the potential of N− layer 3a to trench isolation region 4 or N− layer 3b can efficiently be prevented.

Fourth Embodiment

Figure 8:
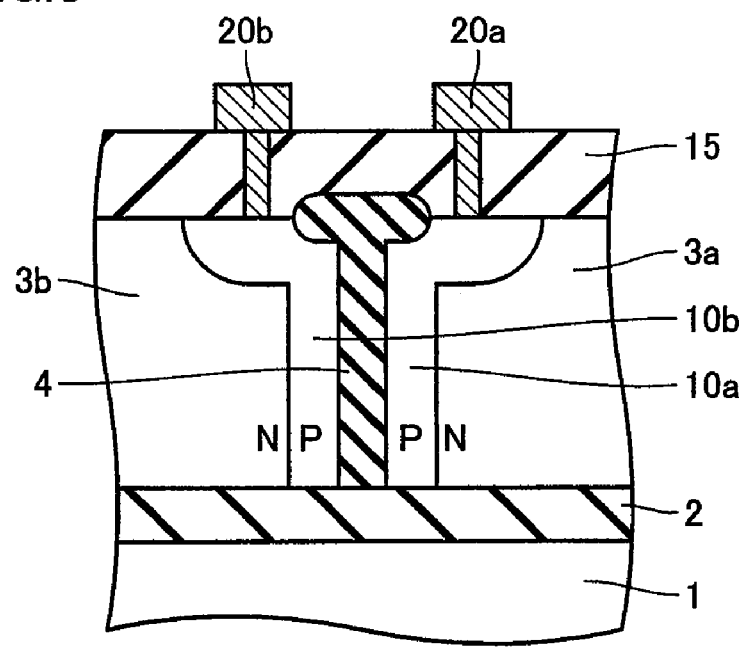
FIG. 8 is a plan view of a semiconductor device in accordance with a fourth embodiment of the present invention.

Here, another example of a semiconductor device, in which the P type diffusion region is kept at a prescribed potential, will be described. Referring to FIG. 8, on insulating film 15, in addition to electrode 20a to be electrically connected to P type diffusion region 10a, an electrode 20b to be connected to P type diffusion region 10b is formed. Except for this point, the semiconductor device is the same as the one shown in FIG. 6. Therefore, the same or corresponding portions will be denoted by the same reference characters, and description thereof will not be repeated.

In the semiconductor device described above, by applying a prescribed voltage to electrode 20a, the potential of P type diffusion region 10a can be kept at a constant value, and by applying a prescribed voltage to electrode 20b, the potential of P type diffusion region 10b can also be kept at a constant value. By way of example, by applying a voltage of 0V to electrodes 20a and 20b, the potential of P type diffusion region 10a as well as P type diffusion region 10b can be kept at 0V.

Therefore, compared with the example in which only the P type diffusion region 10a is provided and kept at 0V, the influence of electric field generated by N− layer 3a to trench isolation region 4 or N− layer 3b can be prevented and the influence of electric field generated by N− layer 3b to trench isolation region 4 or N− layer 3a can also be prevented.

As a result, electrical interaction between N− layers 3a and 3b that will be the element forming regions can surely be prevented. Further, even when a potential is applied to N− layer 3a and N− layer 3b, the electric field does not reach trench isolation region 4, and therefore, reliability of electric isolation can be enhanced.

In the embodiments above, basic structures of the trench isolation region have been described. In the following embodiments, semiconductor elements formed in the element forming region defined by the trench isolation region will be described specifically.

Fifth Embodiment

Figure 9:
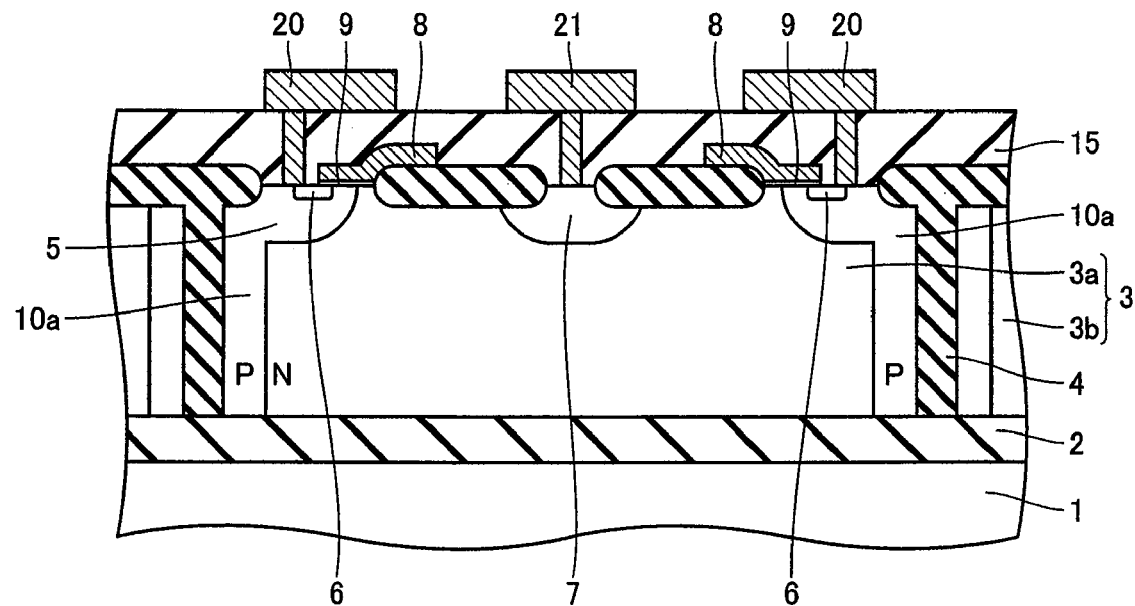
FIG. 9 is a plan view of a semiconductor device in accordance with a fifth embodiment of the present invention.

Here, an n channel MOS transistor will be described as an example of the semiconductor element formed in the element forming region. As shown in FIG. 9, inside the trench isolation region 4, N− layer 3a as the element forming region is positioned. Outside the trench isolation region 4, N− layer 3b as another element forming region is positioned.

On the surface of N− layer 3a, a P type diffusion region 5, which will be a body, is formed to be connected to P type diffusion region 10a formed continuously to be in contact with the entire surface of the inner sidewall of trench isolation region 4. On the surface of P type diffusion region 5, an N+ diffusion region 6, which will be the source, is formed. On that portion of P type diffusion region 5 which is between the N+ diffusion region and N− layer 3, a conductive film 8 to be the gate is formed, with an insulating film 9 interposed.

Spaced apart from P type diffusion region 5, an N+ diffusion region 7, which will be the drain, is formed. An insulating film 15 is formed to cover the element forming region. On insulating film 15, an electrode 20 is formed to be electrically connected to N+ diffusion region 6. Further, an electrode 21 is formed to be electrically connected to N+ diffusion region 7.

In this manner, in the element forming region of N− layer 3, an n channel MOS transistor including N+ diffusion region (source) 6, N+ diffusion region (drain) 7, conductive film (gate) 8 and P type diffusion region (body) 5 is formed. The body is also referred to as a well or a back gate, where a channel is formed and the breakdown voltage is held, in an MOS transistor.

In the semiconductor device described above, P type diffusion region 5 to be the body is connected to P type diffusion region 10 formed continuously to be in contact with the entire surface of the inner sidewall of trench isolation region 4, so that P type diffusion region 10a comes to have a structure that includes P type diffusion region 5. Therefore, it becomes unnecessary to keep a distance between element isolation region 4 and P type diffusion region 5, and the increase of the area occupied by the element forming region can be suppressed.

Further, trench isolation region 4 is electrically isolated from N− layer 3, as P type diffusion region 10 is positioned between trench isolation region 4 and N− layer 3. Therefore, when the impurity concentration of P type diffusion region 10 is sufficiently high, for example, $1 \times 10^{17}$ cm$^{-3}$ or higher, it is possible to prevent the depletion layer from reaching trench isolation region 4 even when the transistor is off and a high voltage acts between the source and drain. Thus, a high electric field does not affect trench isolation region 4, and hence, long time reliability of the semiconductor device can be improved.

In the semiconductor device described above, an upper surface of BOX layer 2 is connected to P type diffusion region 5 to be the body, with P type diffusion region 10 interposed. Therefore, even when a high voltage is applied to N+ diffusion region 7 to be the drain and a P type channel layer is formed near the upper surface of BOX layer 2, holes to form the P type channel layer can be supplied quickly. As a result, speed of operation of the n channel type MOS transistor is improved and the performance of the semiconductor device can be improved.

Sixth Embodiment

Figure 10:
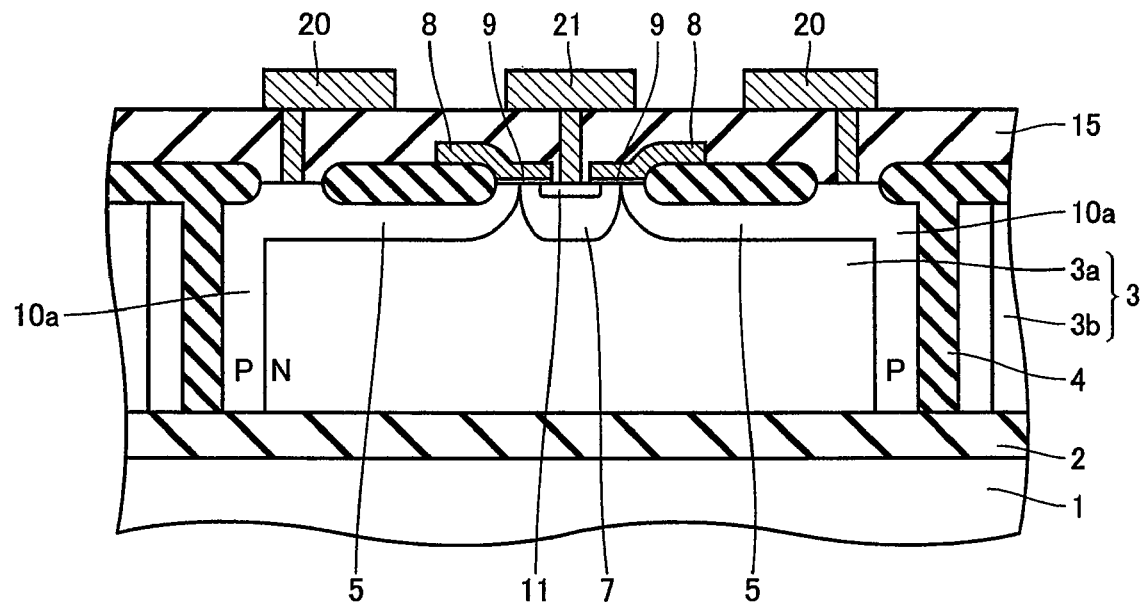
FIG. 10 is a plan view of a semiconductor device in accordance with a sixth embodiment of the present invention.

Here, a p channel MOS transistor will be described as an example of the semiconductor element formed in the element forming region. As shown in FIG. 10, on the surface of N− layer 3a positioned in the element forming region, a P type diffusion region 5 to be the drain is formed to be connected to P type diffusion region 10a, formed continuously to be in contact with the entire surface of the inner sidewall of trench isolation region 4.

Adjacent to P type diffusion region 5, an N type diffusion region 7 to be the body is formed. On the surface of N type diffusion region 7, a P+ diffusion region 11 to be the source is formed. On a portion of N type diffusion region 7 sandwiched between P+ diffusion region 11 and P type diffusion region 5, a conductive film 8 to be the gate is formed, with an insulating film 9 interposed.

An insulating film 15 is formed to cover the element forming region. On insulating film 15, an electrode 20 is formed to be electrically connected to P+ diffusion region 5. Further, an electrode 21 to be electrically connected to P+ diffusion region 11 is formed.

In this manner, in the element forming region formed of N− layer 3, a p channel type MOS transistor including P+ diffusion region (source) 11, P+ diffusion region (drain) 5, a conductive film (gate) 8 and N type diffusion region (body) 7 is formed.

In the semiconductor device described above, as in the n channel type MOS transistor discussed earlier, P type diffusion region 10a formed continuously to be in contact with the entire surface of the inner sidewall of trench isolation region 4 is a part of P type diffusion region 5. Therefore, it is unnecessary to keep a distance between element forming region 4 and P type diffusion region 5, and therefore, increase of the area occupied by the element forming region can be suppressed.

Further, trench isolation region 4 is electrically isolated from N− layer 3 as the P type diffusion region 10 is positioned between trench isolation region 4 and N− layer 3. Therefore, a high electric field does not act on trench isolation region 4, and hence, reliability of the semiconductor device over a long time can be improved.

Seventh Embodiment

Figure 11:
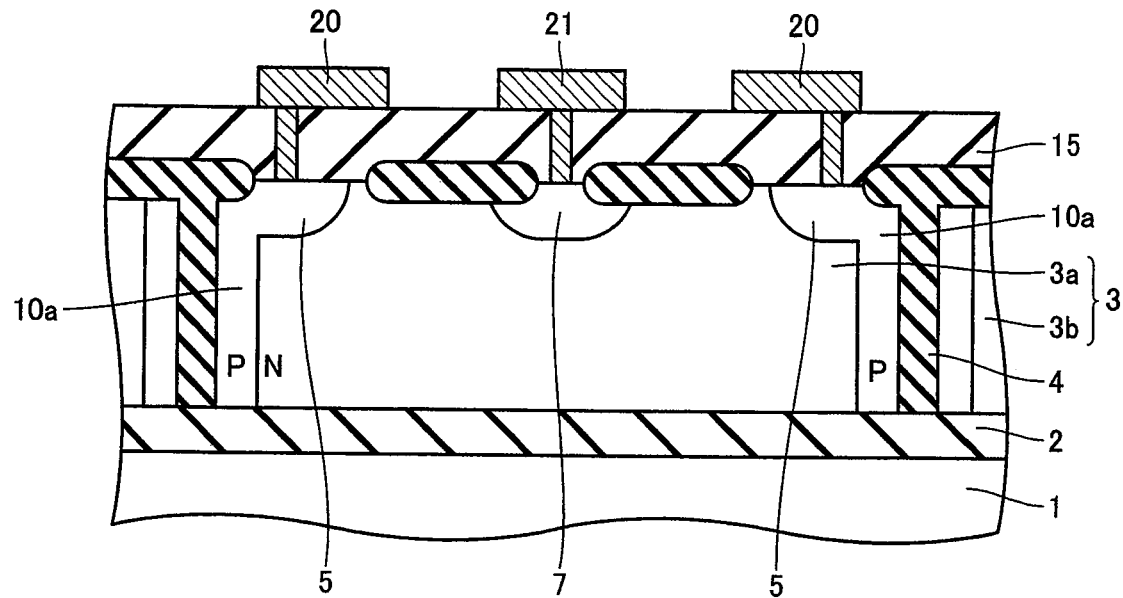
FIG. 11 is a plan view of a semiconductor device in accordance with a seventh embodiment of the present invention.

Here, a diode will be described as a semiconductor element formed in the element forming region. As shown in FIG. 11, on a surface of N− layer 3a positioned in the element forming region, a P type diffusion region 5 to be an anode is formed to be connected to P type diffusion region 10a formed continuously to be in contact with the entire surface of the inner sidewall of trench isolation region 4. Apart from P type diffusion region 5, an N type diffusion region 7 to be a cathode is formed.

An insulating film 15 is formed to cover the element forming region. On insulating film 15, an electrode 20 to be electrically connected to P+ diffusion region 5 is formed. Further, an electrode 21 to be electrically connected to N type diffusion region 7 is formed. In this manner, in the element forming region of N− layer 3, a diode of high breakdown voltage is formed, which includes a P+ diffusion region (anode) 5 and N type diffusion region (cathode) 7.

In the semiconductor device described above, again, the P type diffusion region 10a formed continuously to be in contact with the entire surface of the inner sidewall of trench isolation region 4 is a part of P type diffusion region 5 to be the anode, and therefore, it is unnecessary to keep a distance between element isolating region 4 and P type diffusion region 5. Therefore, increase of the area occupied by the element forming region can be suppressed.

Further, trench isolation region 4 is electrically isolated from N− layer 3 as the P type diffusion region 10 is positioned between trench isolation region 4 and N− layer 3. Therefore, a high electric field does not act on trench isolation region 4, and hence, reliability of the semiconductor device over a long time can be improved.

Eighth Embodiment

Figure 12:
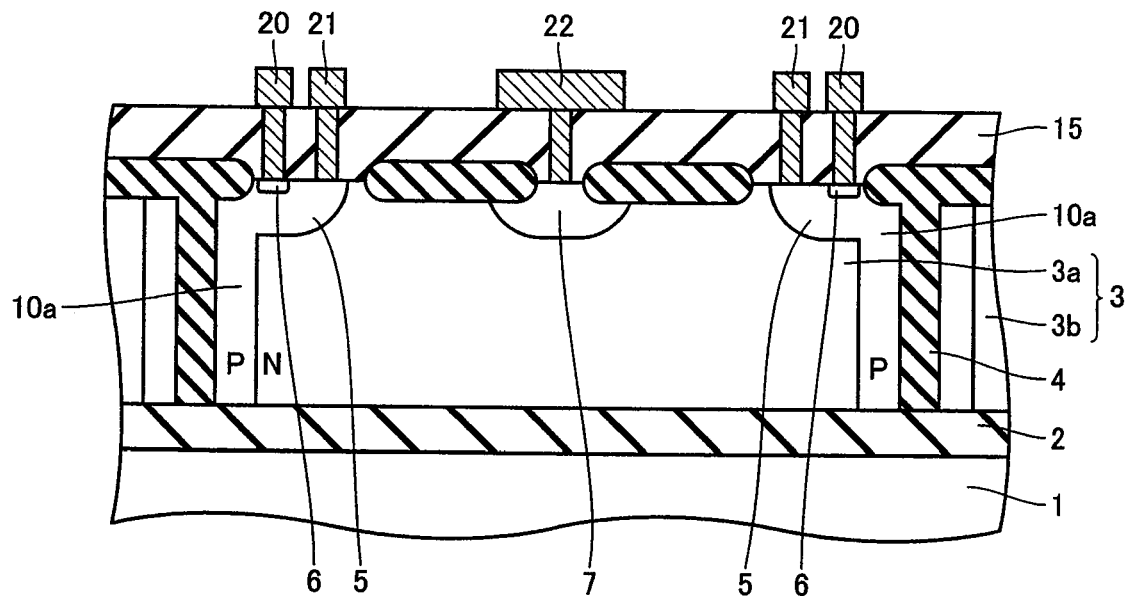
FIG. 12 is a plan view of a semiconductor device in accordance with an eighth embodiment of the present invention.

Here, a bipolar transistor will be described as an example of a semiconductor element formed in the element forming region. As shown in FIG. 12, on a surface of N− layer 3a positioned in the element forming region, a P type diffusion region 5 to be the base is formed to be connected to P type diffusion region 10a formed continuously to be in contact with the entire surface of the inner sidewall of trench isolation region 4. On a surface of P type diffusion region 5, an N+ diffusion region 6 to be the emitter is formed. Apart from P type diffusion region 5, an N type diffusion region 7 to be the collector is formed.

An insulating film 15 is formed to cover the element forming region. On insulating film 15, an electrode 21 is formed to be electrically connected to P+ diffusion region 5. Further, an electrode to be electrically connected to N+ diffusion region 6 is formed. Further, an electrode 22 to be electrically connected to N type diffusion region 7 is formed.

In this manner, in the element forming region of N− layer 3, a bipolar transistor of high breakdown voltage is formed, which includes N+ diffusion region (emitter) 6, P+ diffusion region (base) 5, and N type diffusion region (collector) 7.

In the semiconductor device described above, again, the P type diffusion region 10a formed continuously to be in contact with the entire surface of the inner sidewall of trench isolation region 4 is a part of P type diffusion region 5 to be the base, and therefore, it is unnecessary to keep a distance between element isolating region 4 and P type diffusion region 5. Therefore, increase of the area occupied by the element forming region can be suppressed.

Further, trench isolation region 4 is electrically isolated from N− layer 3 as the P type diffusion region 10 is positioned between trench isolation region 4 and N− layer 3. Therefore, a high electric field does not act on trench isolation region 4, and hence, reliability of the semiconductor device over a long time can be improved.

Ninth Embodiment

When P type diffusion region 10 formed along the inner sidewall of trench isolation region 4 has relatively low impurity concentration, the P type diffusion region may be depleted and the electric field may possibly reach the inside of trench isolation region 4. In that case, it is difficult to maintain reliability of the semiconductor device for a long time.

In the semiconductor devices in accordance with various embodiments described above, P type diffusion regions 10a and 10b have sufficiently high impurity concentrations, and therefore, even when a high voltage is applied to the semiconductor device formed in the element forming region, the depletion layer formed in the N− layer 3a cannot reach the trench isolation region. As a result, no electric field is generated inside the trench isolation region 4, and long time reliability of the semiconductor device can be improved.

Figure 13:
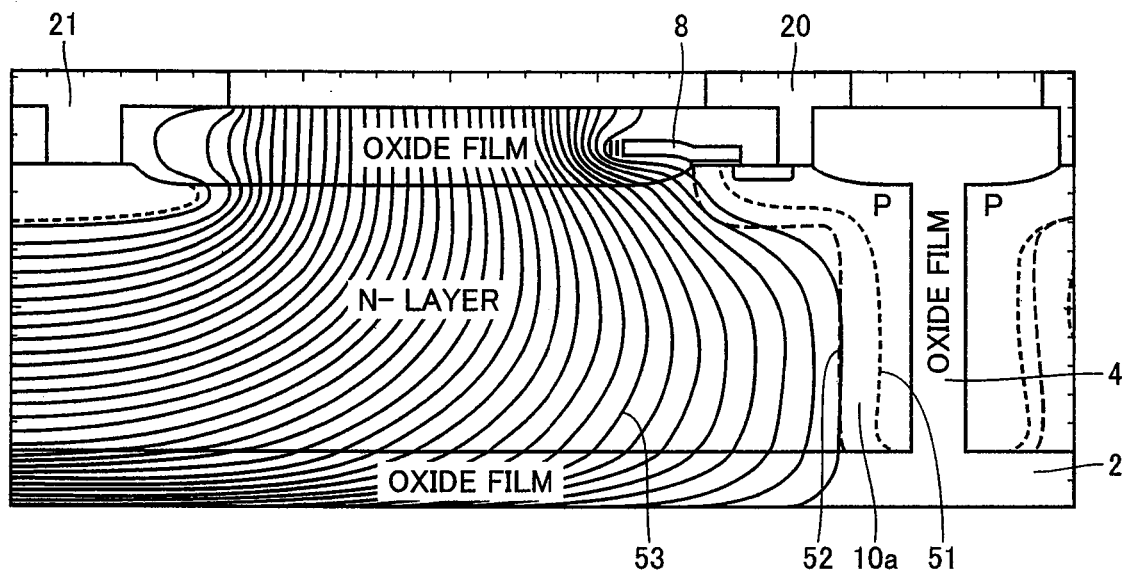
FIG. 13 shows results of simulation of potential distribution and extension of depletion layer in the element forming region in the semiconductor devices in accordance with various embodiments of the present invention.

This was confirmed through simulation, using an n channel MOS transistor as an example. The result is as shown in FIG. 13. In FIG. 13, equipotential distribution and reach of depletion layer are plotted, where the initial conditions of simulation are as follows. Source potential: 0V, gate potential: 0V, substrate potential: 0V, and about 180V is applied to the drain. Here, the impurity concentration of P type diffusion region 10a is set to be at least $1 \times 10^{17}$ cm$^{-3}$.

As shown in FIG. 13, when the impurity concentration of P type diffusion region 10a is sufficiently high, equipotential line 53 does not reach trench isolation region 4, and an edge 51 of depletion layer 51 is positioned in P type diffusion region 4. Thus, it is confirmed through experiment that high electric field does not affect trench isolation region 4 and reliability over a long time can be improved.

Generally, at a portion of element forming region near the sidewall of trench isolation region, crystal defects tend to generate because of damages experienced at the time of forming the trench, or stress experienced when the trench isolation region is filled with an insulating material. An electric field generated at such a portion having crystal defect possibly causes a leakage current.

In each of the semiconductor devices of the embodiments above, P type diffusion region 10a formed continuously to be in contact with the inner sidewall of the trench isolation region has sufficiently high impurity concentration, and therefore, electric field does not reach trench isolation region 4. Therefore, even when a crystal defect generates near trench isolation region 4, generation of leakage current can be prevented.

Tenth Embodiment

In each of the semiconductor devices of the embodiments above, P type diffusion region 10a is formed continuously to be in contact with the entire surface of the inner sidewall of trench isolation region. In order to prevent P type diffusion region 10a from being fully depleted at the time of operation of the element formed in the element forming region, the impurity concentration of P type diffusion region 10a must be made higher than the impurity concentration of each of the diffusion regions forming the element.

By way of example, when an n channel MOS transistor is formed as the semiconductor device, the impurity concentration of P type diffusion region 10a must be made higher than that of P type diffusion layer 5 to be the body. Thus, even when a high electric field is generated as in the transistor-off state, P type diffusion region is not fully depleted. Here, diffusion regions forming the element mean substantial diffusion regions forming the element and do not include regions having relatively high impurity concentration intended to attain electrical connection with the electrode.

Eleventh Embodiment

Figure 14:
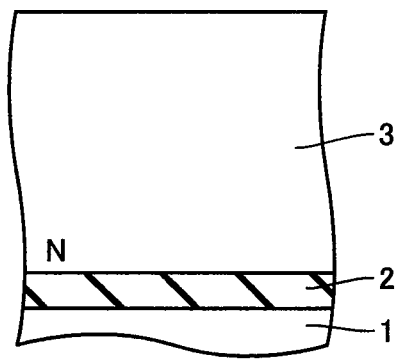
FIG. 14 is a partial sectional view showing a step of manufacturing the semiconductor device in accordance with an eleventh embodiment of the present invention.

An example of a method of manufacturing a semiconductor device having the trench isolation region described with reference to each of the embodiments above will be described. First, as shown in FIG. 14, on a silicon substrate 1 as a supporting substrate, an N− layer 3 is formed to the thickness of 5 μm with a BOX layer 2 having the thickness of about 1 μm interposed, whereby a substrate (SOI substrate) is prepared.

Figure 15:
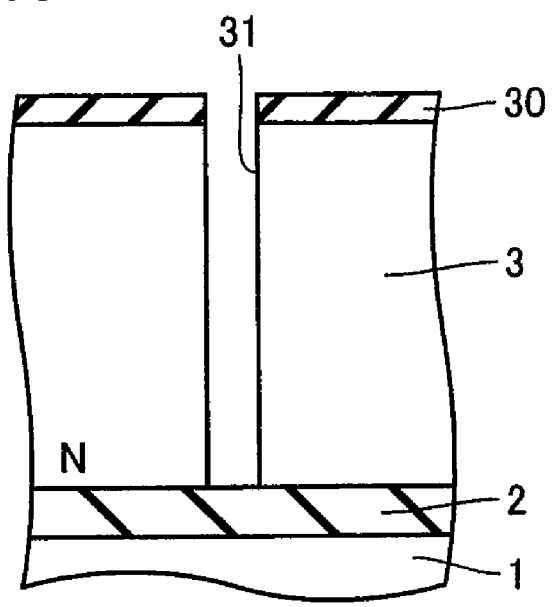
FIG. 15 is a cross-sectional view showing the step following the step shown in FIG. 14.

Thereafter, as shown in FIG. 15, on N− layer 3, a mask material 30 such as a silicon oxide film, having the thickness of about 500 nm is formed. Using the mask material as a mask, N− layer 3 is subjected to anisotropic etching, so that a trench 31 having the width of about 1 μm is formed, exposing the surface of BOX layer 2. Trench 31 is formed continuously to surround a portion to be the element forming region.

Figure 16:
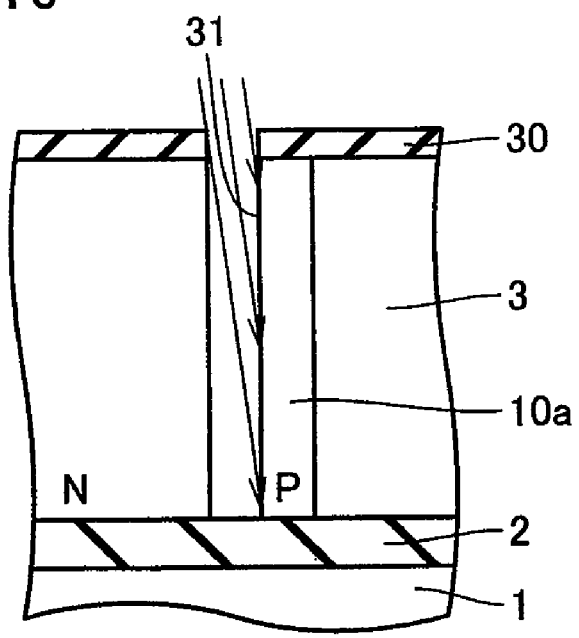
FIG. 16 is a cross-sectional view showing the step following the step shown in FIG. 15.

Thereafter, as shown in FIG. 16, to the entire surface of N− layer 3 exposed on the inner sidewall of trench 31, boron is introduced by oblique ion implantation, with the dosage of $1 \times 10^{13}$ cm$^{-2}$ to $1 \times 10^{15}$ cm$^{-2}$ at an angle of at most 10 degrees, whereby a P type diffusion region 10a is formed. Then, as shown in FIG. 17, also to the entire surface of N− layer 3 exposed on the outer sidewall of trench 31, ion implantation is performed under the same condition, so that a P type diffusion region 10b is formed.

Figure 17:
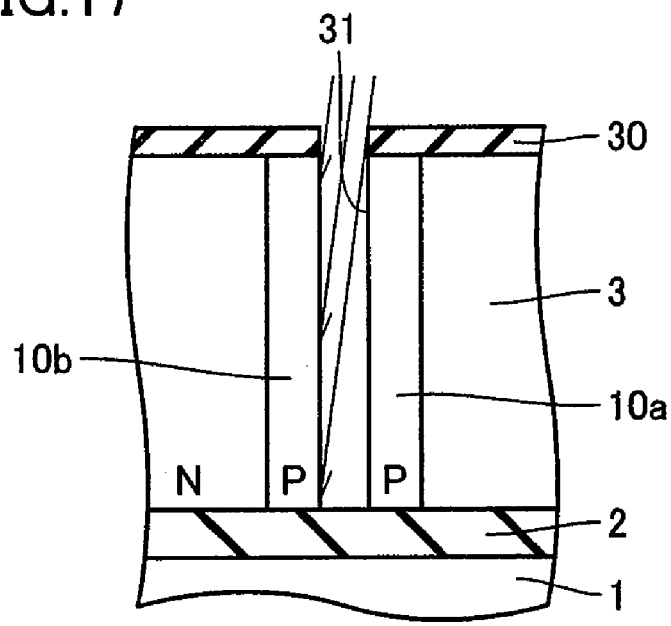
FIG. 17 is a cross-sectional view showing the step following the step shown in FIG. 16.

In FIGS. 16 and 17, an example has been described in which P type diffusion regions 10a and 10b are formed on the inner and outer sidewalls of trench 31, on one cross section of a semiconductor device. It is noted, however, that trench 31 is formed to surround the element forming region, as shown, for example, in FIG. 1. Therefore, oblique ion implantation must be repeated until ions are introduced to all the portions on the outer sidewall and inner sidewall exposed in trench 31 formed to surround the element forming region.

Further, in the step of ion implantation, mask material 30 used for forming trench 31 may be used as a mask for ion implantation. After the end of ion implantation, mask material 30 is removed.

Figure 18:
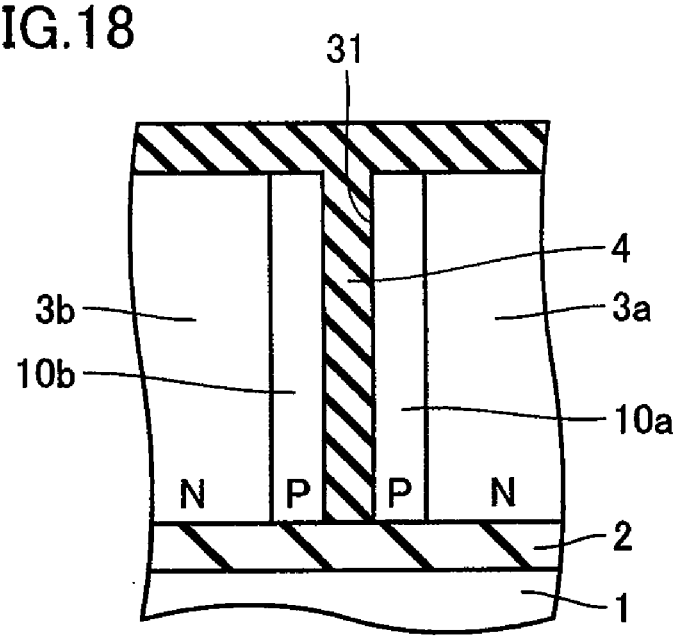
FIG. 18 is a cross-sectional view showing the step following the step shown in FIG. 17.

Referring to FIG. 18, next, a silicon oxide film or the like is filled in trench 31, so that trench isolation region 4 is formed. Thereafter, in N− layer 3a positioned in the element forming region surrounded by trench isolation region 4, a desired semiconductor element such as an MOS transistor is formed (not shown), and the semiconductor device is completed.

In the semiconductor device described above, P type diffusion regions 10a and 10b are formed continuously along the inner sidewall and outer sidewall of trench isolation region 4, respectively. Therefore, trench isolation region 4 is electrically isolated not only by the PN junction between N− layer 3a and P type diffusion region 10a but also by the PN junction between N− layer 3b and P type diffusion region 10b. As a result, electrical isolation between N− layer 3a as one element forming region and N− layer 3b as another element forming region can be made more reliable.

As already described, in order to prevent P type diffusion regions 10a and 10b formed along the inner and outer sidewalls of the trench isolation region from being fully depleted when the element formed in the element forming region operates, the impurity concentration of P type diffusion regions 10a and 10b must be made higher than the impurity concentrations of diffusion regions forming the element.

For this purpose, when P type diffusion regions 10a and 10b are formed, the condition for implantation (dosage) is set such that the impurity concentration of P type diffusion regions 10a and 10b becomes higher than the impurity concentration of the diffusion regions forming the element.

Because of such impurity concentration, even when a high electric field acts on N− layer 3a and the like, P type diffusion region 10a and the like are not fully depleted. The diffusion regions forming the element do not include any region having a relatively high impurity concentration for attaining electrical contact with the electrode.

Though a P type diffusion region has been described as an example of the region formed to be in contact with the entire surface of inner sidewall of the trench isolation region, the structure having reverse conductivities may be possible. In that case, the N type diffusion region formed to be in contact with the inner sidewall of the trench isolation region includes a diffusion region to be a cathode in the case of a diode, and a diffusion region to be a collector in the case of a bipolar transistor.

Twelfth Embodiment

Here, a CMOS transistor will be described as an example, in which an n channel MOS transistor and a P channel MOS transistor are formed as semiconductor elements formed in the element forming region of the semiconductor device having the P type diffusion regions formed in contact with both the inner and outer sidewalls of the trench isolation region.

Figure 19:
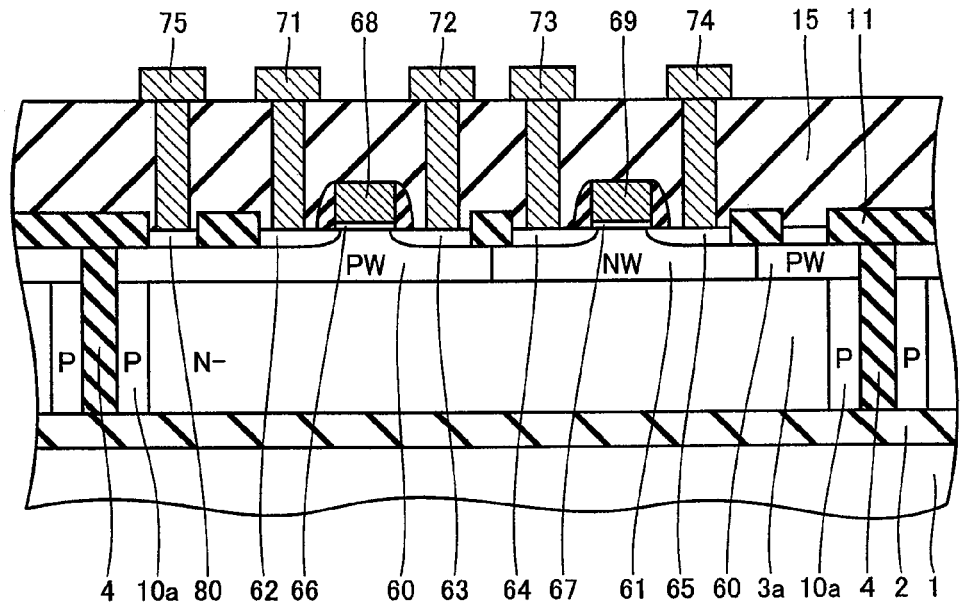
FIG. 19 is a cross-sectional view of a semiconductor device in accordance with a twelfth embodiment of the present invention.

As shown in FIG. 19, at the surface of N− layer 3a surrounded by P type diffusion region 10a and in the vicinity thereof, a P type well region 60 and an N type well region 61 are formed, respectively. On N− layer 3a, an insulating film 11 is formed to expose P type well region 60 and N type well region 61. In the exposed P type well region 60, N type source/drain regions 62 and 63 are formed spaced apart by a prescribed distance from each other. On that region of P type well 60 which is sandwiched between the source/drain regions 62 and 63, a gate electrode 68 is formed, with a gate insulating film 66 interposed. By N type source/drain regions 62, 63 and the gate electrode 68, an n channel MOS transistor is formed.

In exposed N type well 61, P type source/drain regions 64 and 65 are formed spaced apart by a prescribed distance from each other. On that region of N type well region 61 which is sandwiched between the source/drain regions 64 and 65, a gate electrode 69 is formed, with a gate insulating film 67 interposed. By P type source/drain regions 64, 65 and the gate electrode 69, a p channel MOS transistor is formed.

Further, as shown in FIG. 19, P type well region 60 is continuous from P type diffusion region 10a, and is electrically connected to P type diffusion region 10a. In p type well region 60, a P+ diffusion region 80 is formed, and to P+ diffusion region 80, an electrode 75 for fixing the P type well region 60 and P type diffusion region 10a to a prescribed potential is connected. As to the N type well region 61, a prescribed region and an electrode connected to the prescribed region (both not shown) are formed to fix the N type well region 61 to a prescribed potential. Except for these points, the structure is the same as that shown in FIG. 9 or 10, and therefore, same portions are denoted by the same reference characters and description thereof will not be repeated.

A semiconductor device having P type well region 60 connected to P type diffusion region 10a has been described. Next, as a modification, an example in which P type well region 60 is not connected but electrically isolated from P type diffusion region 10a will be described.

First Modification

Figure 20:
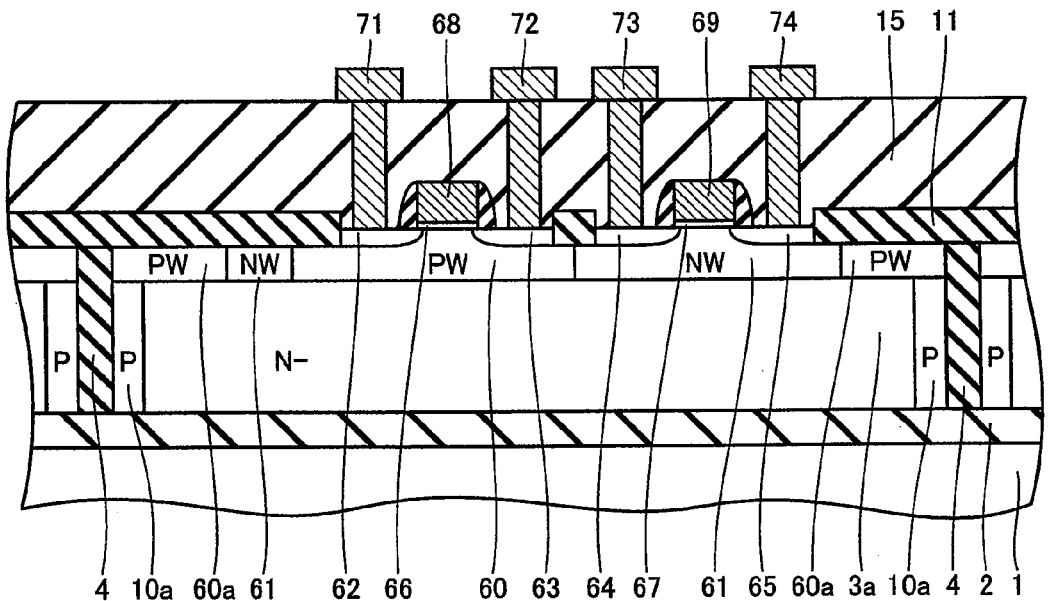
FIG. 20 is a cross-sectional view of a semiconductor device in accordance with a first modification of the twelfth embodiment.

Referring to FIG. 20, P type well region 60 is electrically isolated from P type diffusion region 10a, that is, P type well region 60a, by N type well region 61. More specifically, side portions of P type well 60 are surrounded by N type well region 61, and N− layer 3a is positioned at the bottom of P type well 60. An electrode (not shown) for fixing the P type well region 60 to a prescribed potential is formed in P type well region 60, and an electrode (not shown) for fixing N type well region 61 to a prescribed potential is also formed in N type well region 61.

In the semiconductor device in accordance with the present modification, P type well region 60 is not electrically connected to P type diffusion region 10a, and therefore, it can be fixed to a prescribed potential independent from the potential of P type diffusion region 10a.

Second Modification

Figure 21:
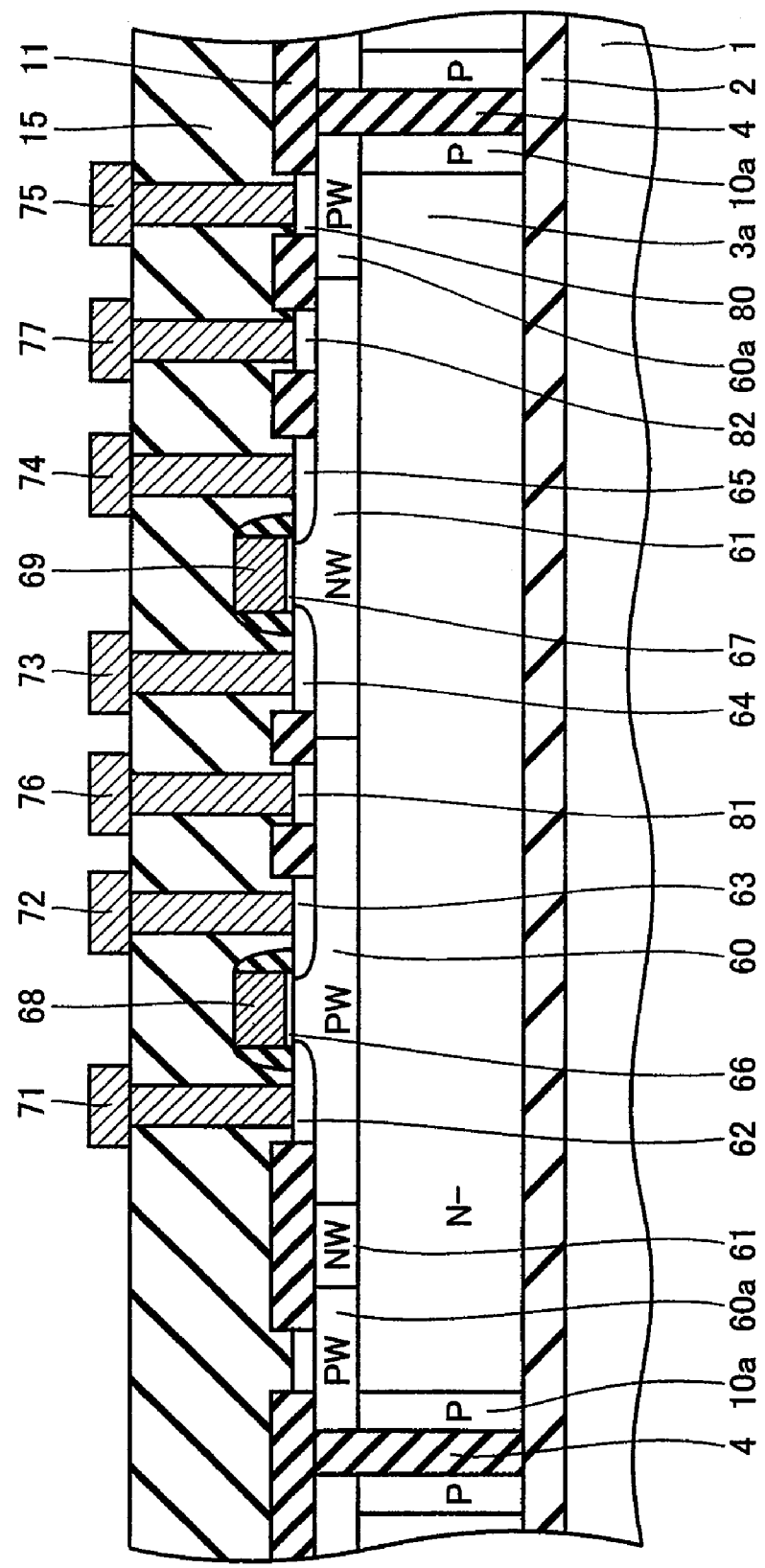
FIG. 21 is a cross-sectional view of a semiconductor device in accordance with a second modification of the twelfth embodiment.

A semiconductor device in which potentials of the P type well region, N type well region and P type diffusion region can be set independently, will specifically be described. Referring to FIG. 21, in P type well region 60, P+ diffusion region 81 is formed, and in N type well region 61, N+ diffusion region 82 is formed. In P type well region 60a that is connected to P type diffusion region 10a, a P+ diffusion region 80 is formed.

To P+ diffusion region 81, an electrode 76 for fixing P type well region 60 to a prescribed potential is connected; to N+ diffusion region 82, an electrode 77 for fixing N type well region 61 to a prescribed potential is connected; and to P+ diffusion region 80, an electrode 75 for fixing P type diffusion region 10a to a prescribed potential is connected.

In the semiconductor device in accordance with the present modification, by applying prescribed potentials to electrodes 76, 77 and 75, respectively, potentials of P type well region 60, N type well region 61 and P type diffusion region 10a can be set independently.

In the semiconductor devices in accordance with the twelfth embodiment, an example has been described in which a CMOS transistor is formed as the semiconductor element in the element forming region. In the semiconductor device having the CMOS transistor also, trench isolation region 4 is electrically isolated from N– layer 3 as there is P type diffusion region 10a between trench isolation region 4 and N– layer 3, and therefore, high electric field does not affect trench isolation region 4. Therefore, reliability of the semiconductor device over a long time can be improved.

Particularly in a semiconductor device having elements of high breakdown voltage and low breakdown voltage, influence of high voltage to trench isolation region 4 is suppressed even in such a pattern having an element of high breakdown voltage arranged adjacent to the element forming region in which a CMOS transistor of low breakdown voltage is formed, and therefore, sufficient reliability is attained.

Thirteenth Embodiment

A flash memory element will be described as an example of a semiconductor element formed in the element forming region of the semiconductor device in which the P type diffusion regions are formed to be in contact with the inner and outer sidewalls of the trench isolation region.

Figure 22:
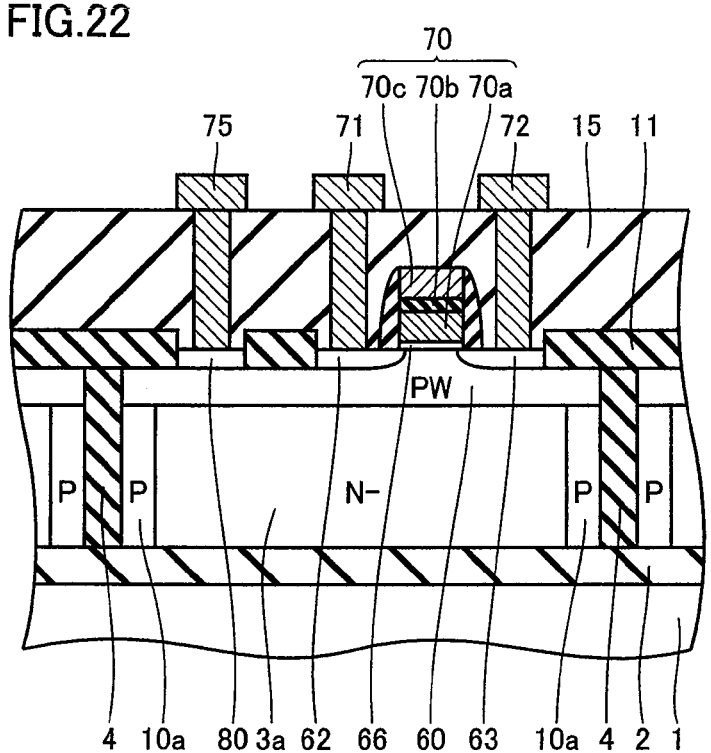
FIG. 22 is a cross-sectional view of a semiconductor device in accordance with a thirteenth embodiment of the present invention.

As shown in FIG. 22, at the surface of N– layer 3a surrounded by P type diffusion region 10a and in the vicinity thereof, a P type well region 60 is formed. On N– layer 3a, an insulating film 11 is formed to expose a surface of P type well region 60. In the exposed P type well region 60, N type source/drain regions 62 and 63 are formed spaced by a prescribed distance from each other. On that region of P type well 60 which is sandwiched between source/drain regions 62 and 63, a gate electrode portion 70 is formed, with a gate insulating film 66 interposed. Gate electrode 70 is formed to have a lower electrode 70a formed on gate insulating film 66, a dielectric film 70b formed on lower electrode 70a, and an upper electrode 70c formed on dielectric film 70b.

P type well region 60 is continuous from P type diffusion region 10a, and is electrically connected to P type diffusion region 10a. On P type well region 60, P+ diffusion region 80 is formed, and to P+ diffusion region 80, an electrode 75 for fixing P type well region 60 and P type diffusion region 10a to a prescribed potential is connected.

In the semiconductor device, P type well region 60 is continuous from P type diffusion region 10a. As a modification, an example in which P type well 60 is not continuous from P type diffusion region 10a and electrically isolated therefrom will be described.

First Modification

Figure 23:
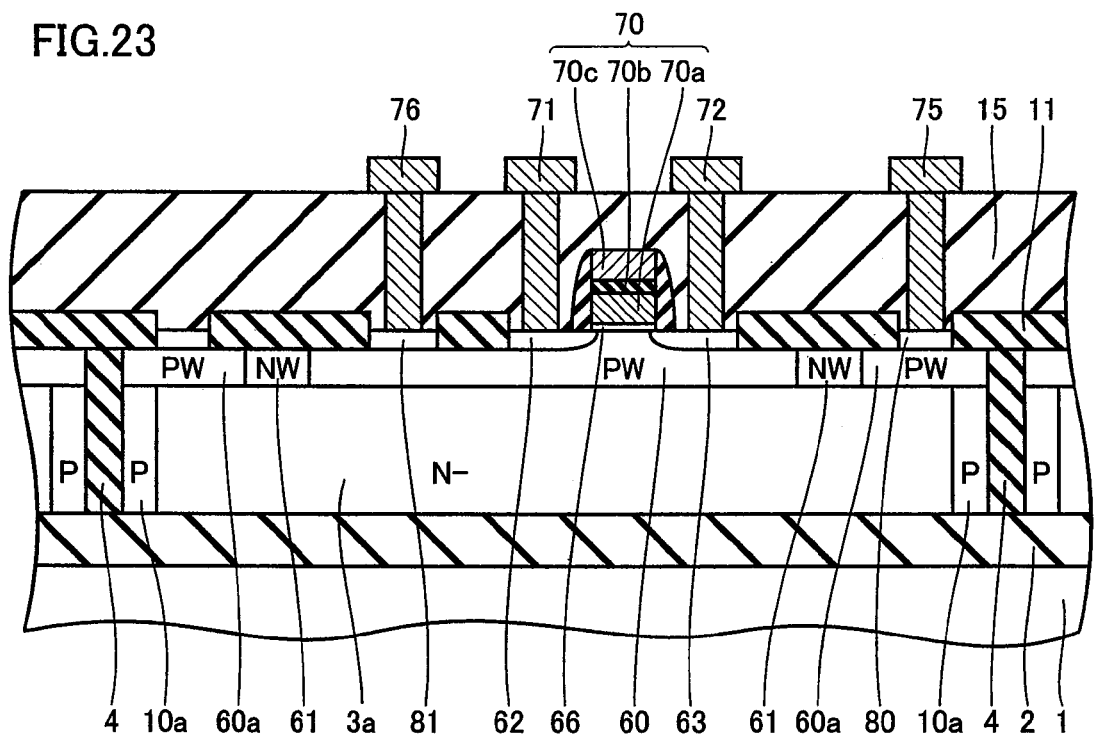
FIG. 23 is a cross-sectional view of a semiconductor device in accordance with a first modification of the thirteenth embodiment.

As shown in FIG. 23, P type well 60 is electrically isolated from P type diffusion region 10a and P type well region 60a, by N type well 61. Specifically, side portions of P type well region 60 are surrounded by N type well region 61, and at the bottom of P type well region 60, N– layer 3a is positioned. In P type well region 60, P+ diffusion region 81 is formed, and to P+ diffusion region 81, an electrode 76 is connected for fixing P type well region 60 to a prescribed potential.

In the semiconductor device in accordance with the first modification, P type well region 60 is not electrically connected to P type diffusion region 10a, and by electrode 76, it can be fixed to a prescribed potential independently from the potential of P type diffusion region 10a.

Second Modification

Figure 24:
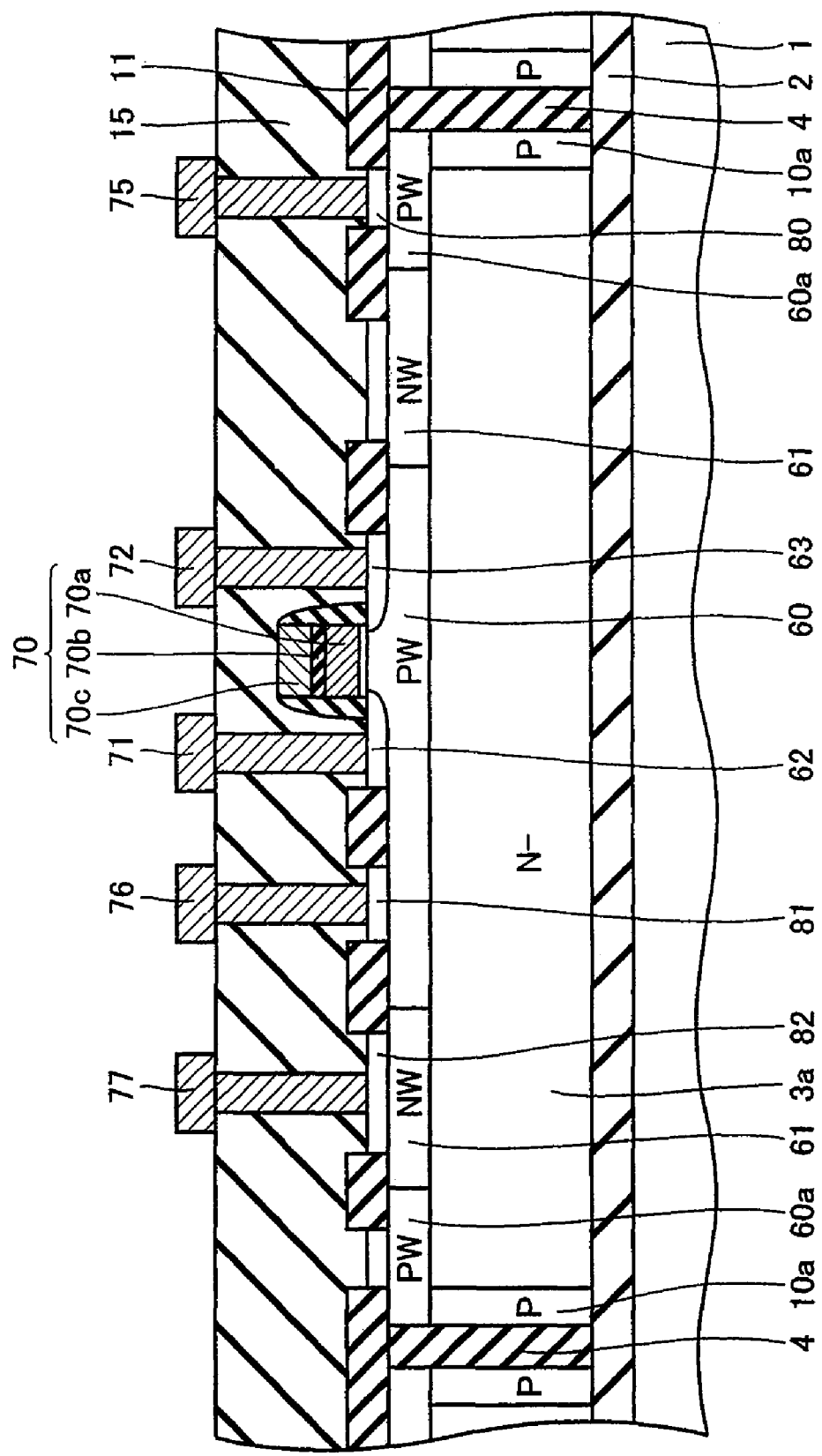
FIG. 24 is a cross-sectional view of a semiconductor device in accordance with a second modification of the thirteenth embodiment.

Here, a semiconductor device in which potentials of the P type well region and P type diffusion region can be set independently, will specifically be described. Referring to FIG. 24, in P type well region 60, P+ diffusion region 81 is formed, and in P type well region 60 continuous from P type diffusion region 10a, P+ diffusion region 80 is formed. To P+ diffusion region 81, an electrode 76 for fixing P type well region 60 to a prescribed potential is connected, and to P+ diffusion region 80, an electrode 75 for fixing P type diffusion region 10a to a prescribed potential is connected.

In the semiconductor device in accordance with the present modification, by applying prescribed potentials to electrodes 76 and 75, respectively, potentials of P type well 60 and P type diffusion region 10a can be set independently. Further, as electrode 77 is connected through N+ diffusion region 82 formed in N type well 61, N type well 61 can also be fixed at a prescribed potential.

In the semiconductor devices in accordance with the thirteenth embodiment, an example has been described in which a flash memory element is formed as a semiconductor element in the element forming region. In the semiconductor device having the flash memory element also, trench isolation region 4 is electrically isolated from N– layer 3 as the P type diffusion region 10 is positioned between trench isolation region 4 and N– layer 3. Therefore, high electric field does not affect trench isolation region 4, and reliability of the semiconductor device over a long time can be improved.

Particularly in a semiconductor device having elements of high breakdown voltage and low breakdown voltage, influence of high voltage to trench isolation region 4 is suppressed even in such a pattern having an element that receives a voltage higher than that applied to the flash memory element arranged adjacent to the element forming region in which a flash memory element is formed, and therefore, sufficient reliability is attained.

It is noted that numerical values such as film thickness and implantation condition mentioned in various embodiments are examples only and not limiting.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   an insulating film formed on a main surface of a prescribed substrate;
   a semiconductor layer of a first conductivity type formed on said insulating film;
   an isolation region, continuously surrounding a prescribed region to be an element forming region in said semiconductor layer, formed from the surface of said semiconductor layer to a surface of said insulating film and having an inner sidewall and an outer sidewall;
   a first impurity region of a second conductivity type, opposite to the conductivity type of the semiconductor layer, formed continuously to be in contact with an entire surface of said inner sidewall of said isolation region, positioned between a portion of said semiconductor layer positioned in said prescribed region and said isolation region; and
   an element arranged in the prescribed region, said element comprising a transistor, said
   transistor including:
      a source region;
      a drain region;
      a body region; and
      a gate formed on the body region;
   another prescribed region to be another element forming region positioned outside said isolating region in said semiconductor layer;

a second impurity region of the second conductivity type formed to be in contact with an entire surface of said outer sidewall of said isolation region, and positioned between a portion of said semiconductor layer positioned in said another prescribed region and said isolation region;

an electrode electrically connected to the source region and the first impurity region to hold the first impurity region at a prescribed potential; and another electrode electrically connected to the second impurity region to hold the second impurity region at a prescribed potential.

2. The semiconductor device according to claim 1, wherein the first impurity region and the second impurity region are held at a same potential.

3. The semiconductor device according to claim 2, wherein said first impurity region is formed to have a prescribed impurity concentration so that an end of a depletion layer extending from an interface between said first impurity region and a portion of said semiconductor layer positioned in said prescribed region does not reach said isolation region during an operation.

4. The semiconductor device according to claim 2, wherein said first impurity region has an impurity concentration set to be higher than that of said element forming region.

* * * * *